United States Patent
Curtis et al.

(10) Patent No.: US 6,446,643 B2
(45) Date of Patent: Sep. 10, 2002

(54) MICRO-ENVIRONMENT CHAMBER AND SYSTEM FOR RINSING AND DRYING A SEMICONDUCTOR WORKPIECE

(75) Inventors: Gary L. Curtis, Kila; Raymon F. Thompson, Kalisell, both of MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/881,246

(22) Filed: Jun. 12, 2001

Related U.S. Application Data

(62) Division of application No. 09/041,649, filed on Mar. 13, 1998, now Pat. No. 6,318,385.

(51) Int. Cl.⁷ .................................................. B08B 3/02
(52) U.S. Cl. .................. 134/25.4; 134/33; 134/95.3; 134/102.3; 134/182; 134/902
(58) Field of Search ............................. 134/148, 147, 134/153, 200, 95.3, 102.3, 102.1, 182, 902, 25.4, 33

(56) References Cited

U.S. PATENT DOCUMENTS

| | | |
|---|---|---|
| 3,727,620 A | 4/1973 | Orr |
| 3,953,265 A | 4/1976 | Hood |
| 4,132,567 A | 1/1979 | Blackwood |
| 4,439,243 A | 3/1984 | Titus |
| 4,439,244 A | 3/1984 | Allevato |
| 4,544,446 A | 10/1985 | Cady |
| 4,664,133 A | 5/1987 | Silvernail et al. |
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka |
| 5,032,217 A | 7/1991 | Tanaka |
| 5,117,769 A | 6/1992 | DeBoer |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,513,594 A | 5/1996 | McClanahan et al. |
| 5,551,986 A | 9/1996 | Jain |

(List continued on next page.)

FOREIGN PATENT DOCUMENTS

| | | |
|---|---|---|
| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1-120023 | 5/1989 |
| JP | 4 94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| JP | 1-283845 | 11/1999 |

*Primary Examiner*—Frankie L. Stinson
(74) *Attorney, Agent, or Firm*—Lyon & Lyon LLP

(57) ABSTRACT

In a method for rinsing and drying a semiconductor workpiece in a micro-environment, the workpiece is placed into a rinser/dryer housing. The rinser/dryer housing is rotated by a rotor motor. The rinser/dryer housing defines a substantially closed rinser/dryer chamber. Rinsing and drying fluids are distributed across at least one face of the semiconductor workpiece by the action of centrifugal force generated during rotation of the housing. A fluid supply system is connected to sequentially supply a rinsing fluid followed by a drying fluid to the chamber as the housing is rotated.

36 Claims, 14 Drawing Sheets

U.S. PATENT DOCUMENTS

| | | |
|---|---|---|
| 5,591,262 A | 1/1997 | Sago et al. |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |
| 5,718,763 A | 2/1998 | Tateyama et al. |
| 5,762,708 A | 6/1998 | Motoda et al. |
| 5,762,751 A | 6/1998 | Bleck et al. |
| 5,779,796 A | 7/1998 | Tomoeda et al. |
| 5,815,762 A | 9/1998 | Sakai et al. |
| 5,845,662 A | 12/1998 | Sumnitsch |
| 5,860,640 A | 1/1999 | Marohl et al. |
| 5,868,866 A | 2/1999 | Maekawa et al. |
| 5,882,433 A | 3/1999 | Ueno |
| 5,885,755 A | 3/1999 | Nakagawa et al. |
| 5,916,366 A | 6/1999 | Ueyama et al. |
| 5,942,035 A | 8/1999 | Hasebe et al. |
| 5,997,653 A | 12/1999 | Yamasaka |

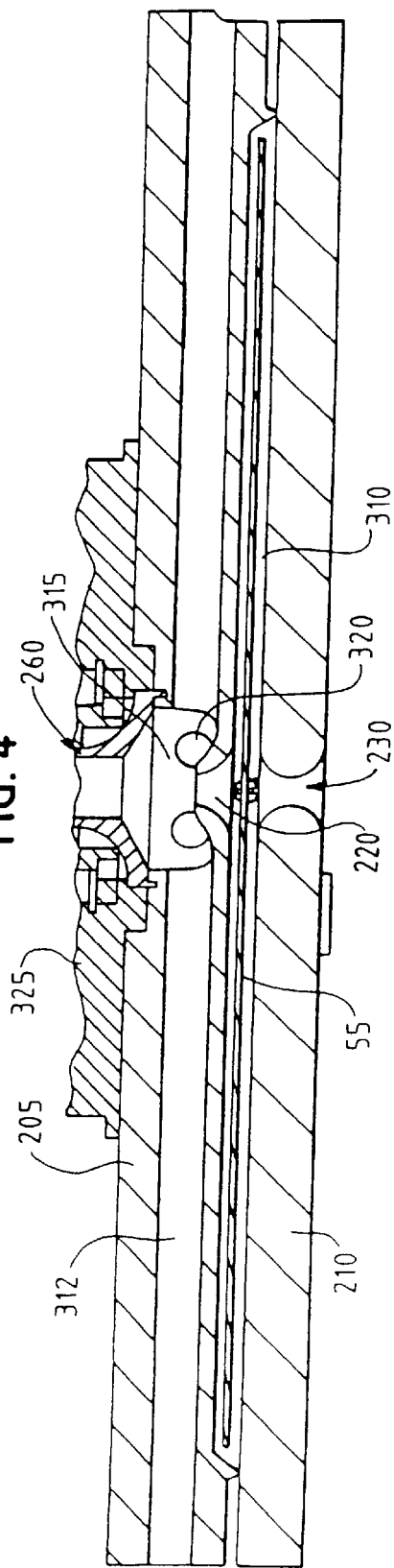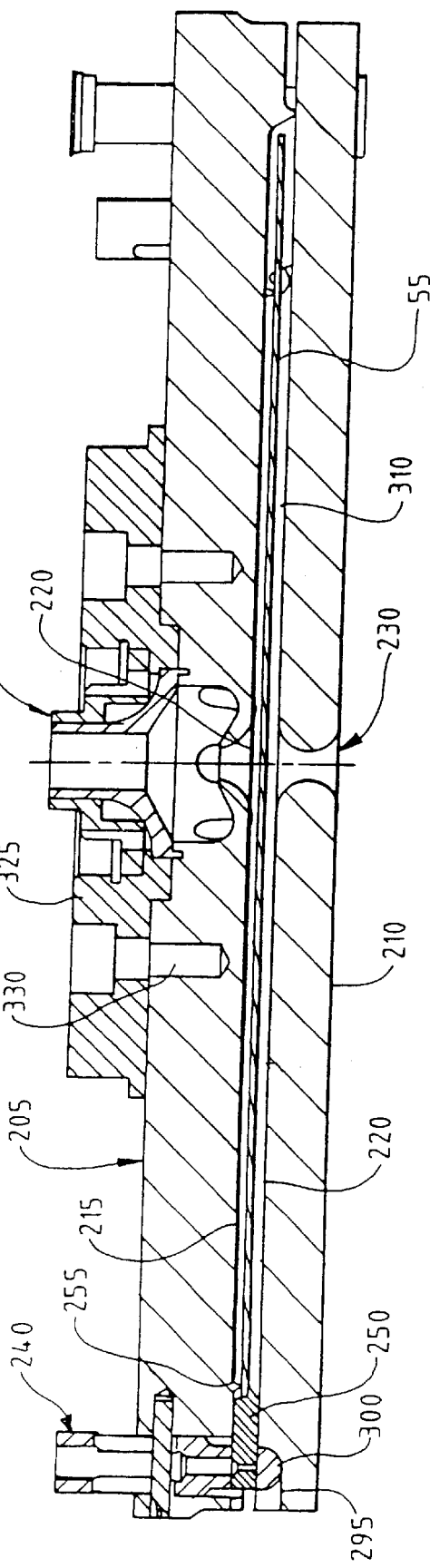

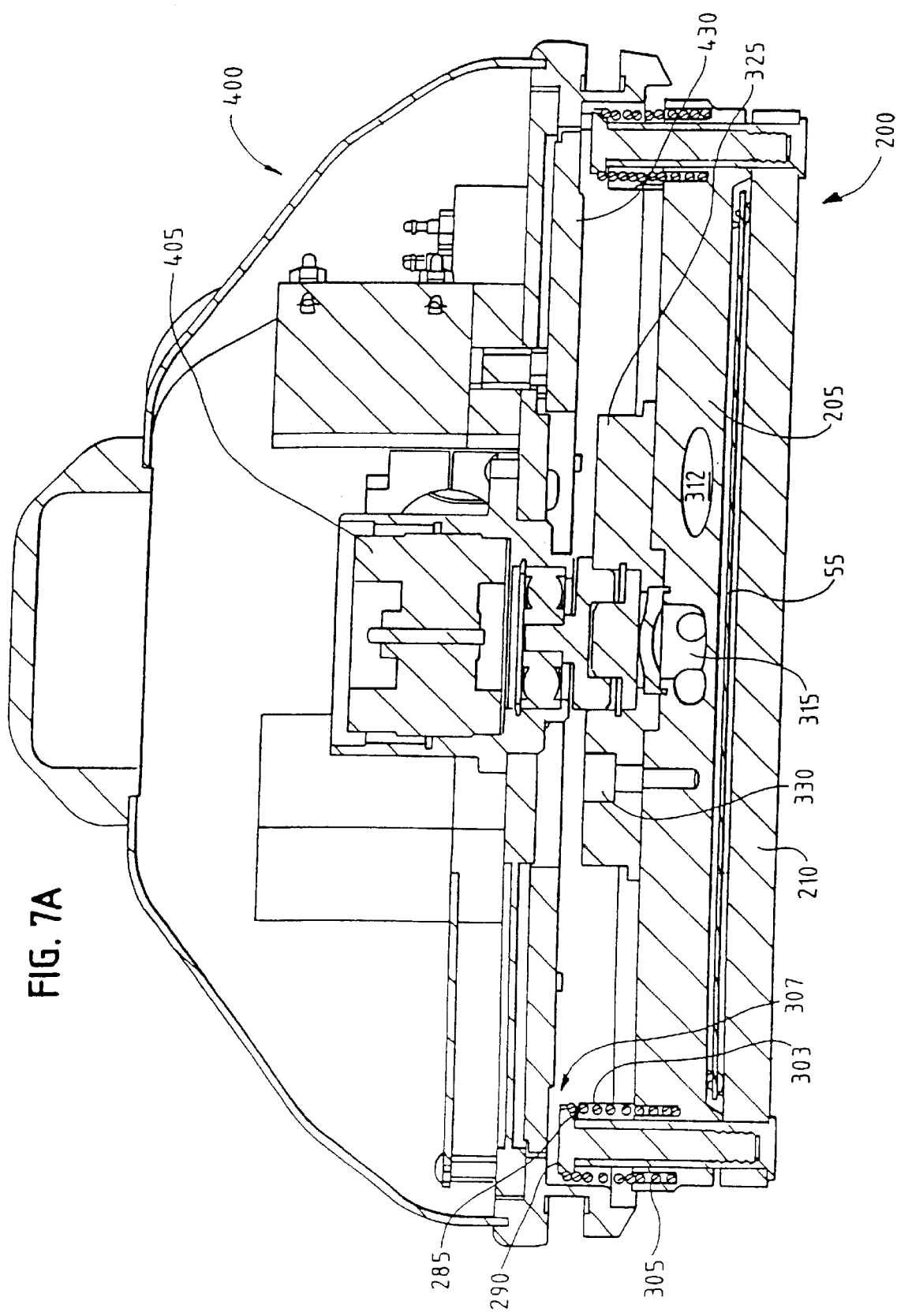

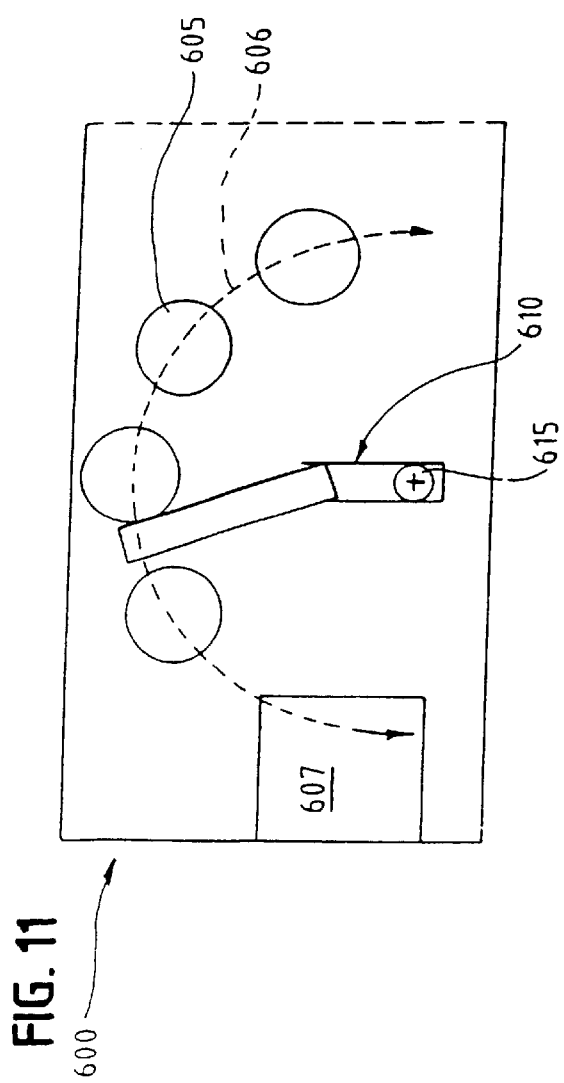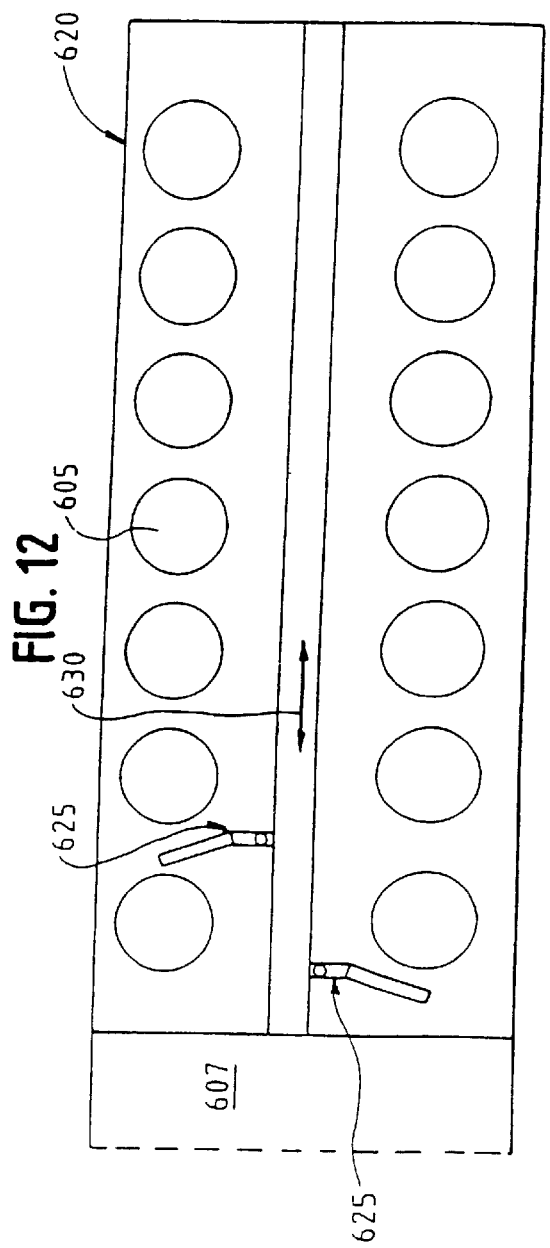

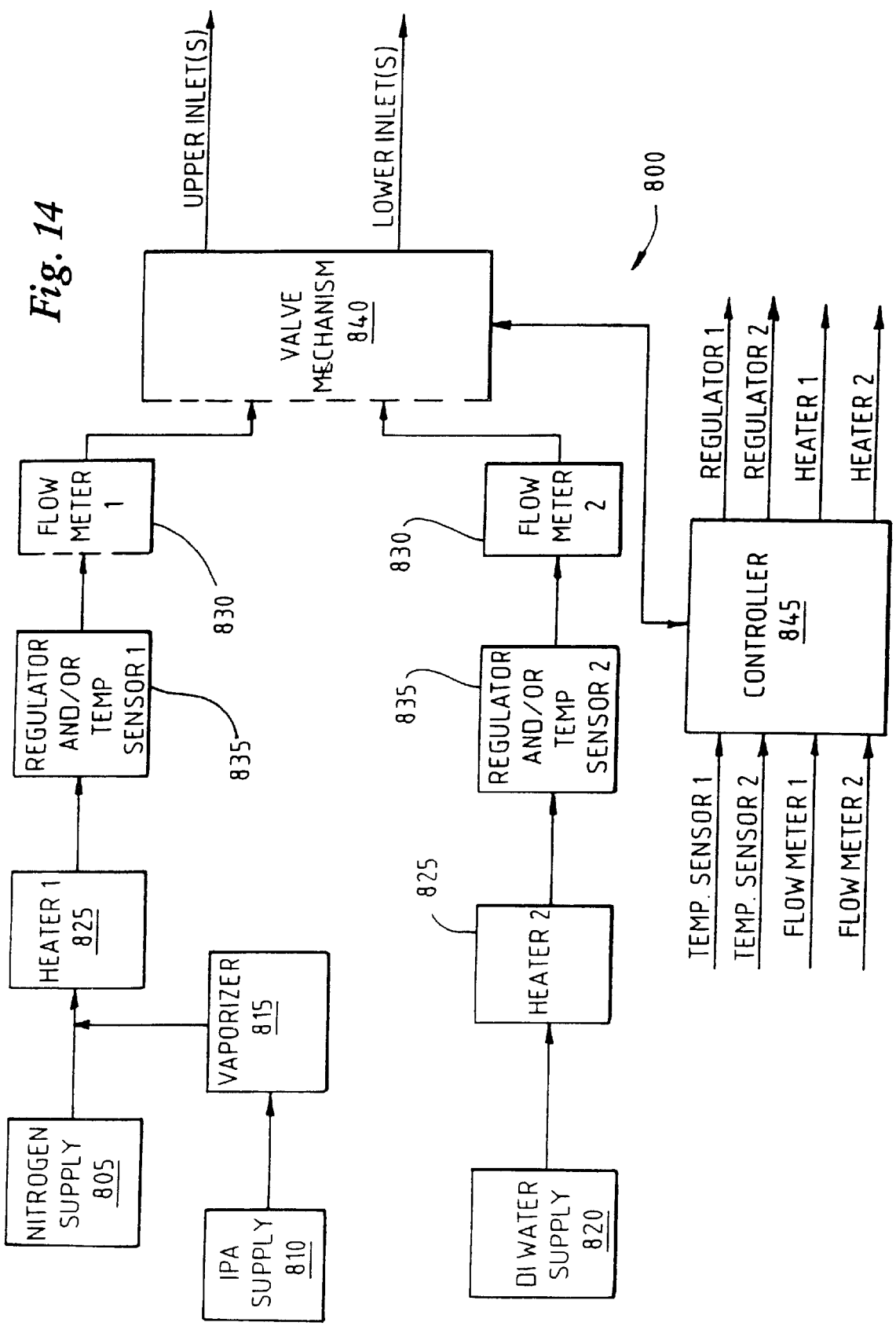

MICRO-ENVIRONMENT CHAMBER AND SYSTEM FOR RINSING AND DRYING A SEMICONDUCTOR WORKPIECE

This Application is a Divisional of U.S. patent application Ser. No. 09/041,649 filed Mar. 13, 1998, and now U.S. Pat. No. 318,385, and incorporated herein by reference.

BACKGROUND OF THE INVENTION

The semiconductor manufacturing industry is constantly seeking to improve the processes used to manufacture integrated circuits from wafers. The improvements come in various forms but, generally, have one or more objectives as the desired goal. The objectives of many of these improved processes include: 1) decreasing the amount of time required to process a wafer to form the desired integrated circuits; 2) increasing the yield of usable integrated circuits per wafer by, for example, decreasing the likelihood of contamination of the wafer during processing; 3) reducing the number of steps required to turn a wafer into the desired integrated circuits; and 4) reducing the cost of processing the wafers into the desired integrated circuit by, for example, reducing the costs associated with the chemicals required for the processing.

One of the most crucial processes in the fabrication of integrated circuits involves the rinsing and drying of the semiconductor wafers between various chemical processing steps. During rinsing, de-ionized (DI) water is often used to assist in the removal of chemicals from the surface of the wafer. After rinsing is completed, the wafer surface must be dried. During the drying step wafer contamination often results. Such contamination is due to evaporation of the DI water deposits contaminant particles on the wafer surface.

Various techniques have been proposed for the rinsing and drying of semiconductor wafers. One technique used to both rinse and dry wafers relies upon a spin rinser/dryer. Such a system uses a DI rinse water spray to rinse the wafer. The wafer is spun during the drying step thereby removing the water from the surface of the semiconductor wafer through evaporation and the action of centripetal acceleration.

Other techniques used to dry wafers include the use of IPA vapor dryers, full displacement IPA dryers, and other forms of IPA dryers. These IPA dryers rely upon a large quantity of a solvent, such as IPA and other volatile organic liquids, to facilitate drying of the semiconductor wafer. One limitation of this type of dryer is its use of large solvent quantities which are highly flammable and often hazardous to health and environment. Further, these dryer types are often quite expensive. Still further, the large quantities of hot solvent are often incompatible with certain recessed pattern wafers and may be detrimental to certain device structures.

Another drying technique uses hot DI process water to rinse and promote drying of the semiconductor wafer. Since the DI water is heated, the liquid on the wafer evaporates faster and more efficiently than DI water at standard ambient temperatures.

A still further drying technique is known as a Marangoni dryer. In a Marangoni dryer, the wafer is slowly withdrawn from the rinsing liquid in an atmosphere having a vapor that is miscible with the rinsing liquid. As the wafer is withdrawn, a meniscus is formed at the wafer surfaces. The surface tension of the rinsing fluid at the meniscus is reduced as a result of the presence of the vapor. The reduced surface tension gives rise to a substantially particle free drying process.

In each of the foregoing processes, one or more wafers are disposed in an open chamber during the rinsing and/or drying process. In the open chamber, the semiconductor wafers are exposed to a large rinse bath and relatively large area of ambient air. Particles that contaminate the wafer during the rinsing and drying processes often come directly from the rinse water and ambient air. Control of the contaminants in the rinsing bath and ambient air in these systems is often difficult and requires rather elaborate filter systems.

The approach to rinsing and drying of semiconductor wafers provided by the invention offers greater control of the physical properties of the rinsing and drying fluids. Further, wafers may be rinsed and dried on an individual basis more quickly when compared to the drying of an individual wafer using any of the foregoing processes.

SUMMARY OF THE INVENTION

An apparatus for rinsing and drying a semiconductor workpiece in a micro-environment is set forth. The apparatus includes a rotor motor and a rinser/dryer housing. The rinser/dryer housing is connected to be rotated by the rotor motor. The rinser/dryer housing further defines a substantially closed rinser/dryer chamber therein in which rinsing and drying fluids are distributed across at least one face of the semiconductor workpiece by the action of centripetal acceleration generated during rotation of the housing. A fluid supply system is connected to sequentially supply a rinsing fluid followed by a drying fluid to the chamber as the housing is rotated.

In accordance with one embodiment of the apparatus, the rinser/dryer housing includes an upper chamber member having a fluid inlet opening and a lower chamber member having a fluid inlet opening. The upper chamber member and the lower chamber member are joined to one another to form the substantially closed rinser/dryer chamber. The rinser/dryer chamber generally conforms to the shape of the semiconductor workpiece and includes at least one fluid outlet disposed at a peripheral region thereof. At least one semiconductor workpiece support is provided. The support is adapted to support a semiconductor workpiece in the substantially closed rinser/dryer chamber in a position to allow distribution of a fluid supplied through the inlet opening of the upper chamber member across at least an upper face of the semiconductor workpiece through centripetal acceleration generated when the rinser/dryer housing is rotated. The wafer is further positioned by the support to allow distribution of a fluid supplied through the inlet opening of the lower chamber member across at least a lower face of the semiconductor workpiece during the rotation through the action of centripetal acceleration. The at least one fluid outlet is positioned to allow escape of fluid from the rinser/dryer chamber through action of centripetal acceleration.

BRIEF DESCRIPTION OF THE SEVERAL VIEWS OF THE DRAWINGS

FIG. 4 is a cross-sectional view of the rinser/dryer housing taken along line IV—IV of FIG. 3.

FIG. 5 is a cross-sectional view of the rinser/dryer housing taken along line V—V of FIG. 3.

FIGS. 7A and 7B are cross-sectional views showing the rinser/dryer housing in a closed state and connected to a rotary drive assembly.

FIGS. 11 and 12 are schematic diagrams of exemplary processing tools that employ the rinser/dryer of the present invention.

FIG. 14 is a schematic diagram of one embodiment of a fluid supply system that may be used to supply rinsing and drying fluids to the rinser/dryer.

DETAILED DESCRIPTION OF THE INVENTION

Figure 1:
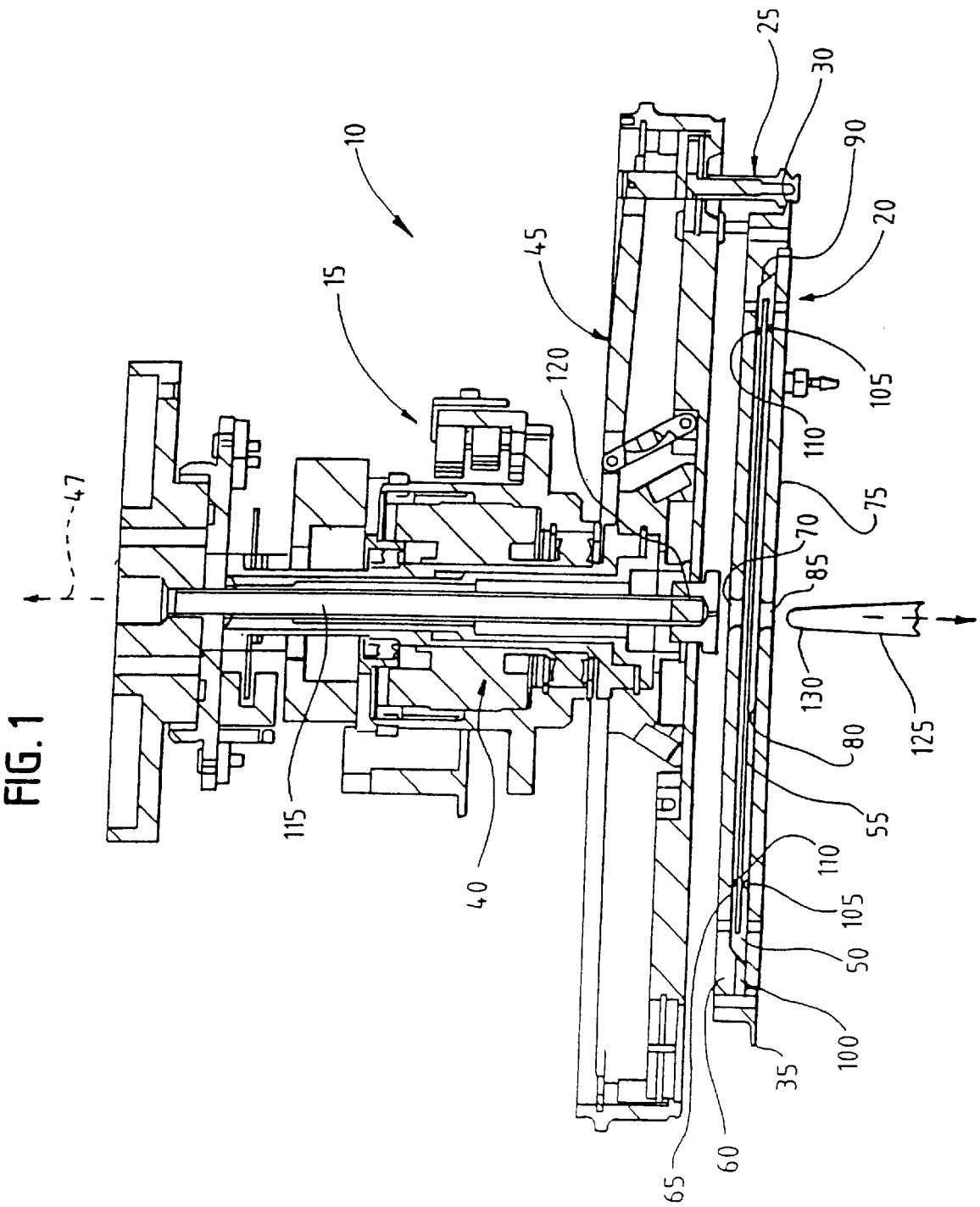
FIG. 1 is a cross-sectional view of a rinser/dryer housing and a rotor assembly constructed in accordance with one embodiment of the invention.

FIG. 1 is a cross-sectional view of one embodiment of a rinser/dryer, shown generally at 10, constructed in accordance with the teachings of the present invention. The embodiment of the rinser/dryer 10 of FIG. 1 is generally comprised of a rotor portion 15 and a rinser/dryer housing 20. The rotor portion 15 includes a plurality of support members 25 that extend downwardly from the rotor portion 15 to engage the rinser/dryer housing 20. Each of the support members 25 includes a groove 30 that is dimensioned to engage a radially extending flange 35 that extends about a peripheral region of the rinser/dryer housing 20. Rotor portion 15 further includes a rotor motor assembly 40 that is disposed to rotate a hub portion 45, including the support members 25, about a central axis 47. Rinser/dryer housing 20 is thus secured for co-rotation with hub portion 45 when support members 25 are engaged with flange 35. Other constructions of the rotor portion 15 and the engagement mechanism used for securement with the rinser/dryer housing 20 may also be used.

The rinser/dryer housing 20 of the embodiment of FIG. 1 defines a substantially closed rinser/dryer chamber 50. Preferably, the substantially closed rinser/dryer chamber 50 is formed in the general shape of the workpiece 55 and closely conforms with the surfaces of the workpiece. The specific construction of FIG. 1 includes an upper chamber member 60 having an interior chamber face 65. The upper chamber member 60 includes a centrally disposed fluid inlet opening 70 in the interior chamber face 65. The specific construction also includes a lower chamber member 75 having, an interior chamber face 80. The lower chamber member 75 has a centrally disposed fluid inlet opening 85 in the interior chamber face 80. The upper chamber member 60 and the lower chamber member 75 engage one another to define the rinser/dryer chamber 50. The upper chamber member 60 includes sidewalls 90 that project downward from the interior chamber face 65. One or more outlets 100 are disposed at the peripheral regions of the rinser/dryer chamber 50 through the sidewalls 90 to allow fluid within the chamber 50 to exit therefrom through centripetal acceleration that is generated when the housing 20 is rotated about axis 47.

In the illustrated embodiment, the workpiece 55 is a generally circular wafer having upper and lower planar surfaces. As such, the rinser/dryer chamber 50 is generally circular in plan view and the interior chamber faces 65 and 80 are generally planar and parallel to the upper and lower planar surfaces of the workpiece 55. The spacing between the interior chamber faces 65 and 80 and the upper and lower planar surfaces of the workpiece 55 is generally quite small. Such spacing is preferably minimized to provide substantial control of the physical properties of a rinsing/drying fluid flowing through the interstitial regions.

The wafer 55 is spaced from the interior chamber face 80 by a plurality of spacing, members 105 extending from the interior chamber face 80. Preferably, a further set of spacing members 110 extend from the interior chamber face 65 and are aligned with the spacing members 105 to grip the wafer 55 therebetween.

Fluid inlet openings 70 and 85 provide communication passageways through which one or more rinsing/drying fluids may enter the chamber 50 for processing the wafer surfaces. In the illustrated embodiment, rinsing/drying fluids are delivered from above the wafer 55 to inlet 70 through a fluid supply tube 115 having a fluid outlet nozzle 120 disposed proximate inlet 70. Fluid supply tube 115 extends centrally through the rotor portion 15 and is preferably concentric with the axis rotation 47. Similarly, rinsing/drying fluids are delivered from below the wafer 55 to inlet 85 through a fluid supply tube 125. Fluid supply tube 125 terminates at a nozzle 130 disposed proximate inlet 85. Although nozzles 120 and 130 terminate at a position that is spaced from their respective inlets, it will be recognized that tubes 115 and 125 may be extended so that gaps 135 are not present. Rather, nozzles 120 and 130 or tubes 115 and 125 may include rotating seal members that abut and seal with the respective upper and lower chamber members 60 and 75 in the regions of the inlets 70 and 85. In such instances, care should be exercised in the design of the rotating joint so as to minimize any contamination resulting from the wear of any moving component.

During processing, one or more rinsing/drying fluids are individually or concurrently supplied through fluid supply tubes 115 and 125 and inlets 70 and 85 for contact with the surfaces of the workpiece 55 in the chamber 50. Preferably, the housing 20 is rotated about axis 47 by the rotor portion 15 generate a continuous flow of any fluid within the chamber 50 across the surfaces of the workpiece 55 through the action of centripetal acceleration. Rinsing/drying fluid entering the inlet openings 70 and 85 are thus driven across the workpiece surfaces in a direction radially outward from the center of the workpiece 55 to the exterior perimeter of the workpiece 55. At the exterior perimeter of the workpiece 55, any spent rinsing/drying fluid is directed to exit the chamber 50 through outlets 100 as a result of the centripetal acceleration. Spent rinsing/drying fluids may be accumulated in a cup reservoir disposed below and/or about the rinser/dryer housing 20. As will be set forth below in an alternative embodiment, the peripheral regions of the rinser/dryer housing 20 may be constructed to effectively separate the rinsing/drying fluids provided through inlet 70 from the rinsing/drying fluids supplied through inlet 85 so that opposite surfaces of wafer 55 are processed using different rinsing/drying fluids. In such an arrangement, the separate rinsing/drying fluids may be separately accumulated at the peripheral regions of the housing 20 for disposal or re-circulation.

In the embodiment of FIG. 1, the rinser/dryer housing 20 may constitute a single wafer pod that may be used to transport the workpiece 55 between various processing stations and/or tools. If transport of the housing 20 between the processing stations and/or tools takes place in a clean room environment, the various openings of the housing 20 need not be sealed. However, if such transport is to take place in an environment in which wafer contaminants are present, sealing of the various housing openings should be effected. For example, inlets 70 and 85 may each be provided with respective polymer diaphragms having slits disposed therethrough. The ends of fluid supply tubes 115 and 125 in such instances may each terminate in a tracor structure that may be used to extend through the slit of the respective diaphragm and introduce the rinsing/drying fluid into the chamber 50. Such tracor/slitted diaphragm constructions are used in the medical industry in intravenous supply devices. Selection of the particular polymer material used for the diaphragms should take into consideration the particular rinsing/drying fluids that will be introduced therethrough. Similar sealing of the outlets 100 may be undertaken in which the tracor structures are inserted into the diaphragms once the housing 20 is in a clean room environment.

Alternatively, the outlets 100 themselves may be constructed to allow fluids from the rinser/dryer chamber to exit therethrough while inhibiting the ability of fluids to proceed from the exterior of housing 20 into chamber 50. This effect may be achieved, for example, by constructing the openings 100 as nozzles in which the fluid flow opening as a larger diameter at the interior of chamber 50 than the diameter of the opening at the exterior of the housing 20. In a further construction, a rotational valve member may be used in conjunction with the plurality of outlets 100. The valve member, such as a ring with openings corresponding to the position of outlets 100, would be disposed proximate the opening, 100 and would be rotated to seal with the outlets 100 during transport. The valve member would be rotated to open outlets 100 during processing. Inert gas, such as nitrogen, can be injected into the chamber 50 through supply tubes 115 and 125 immediately prior to transport of the housing to a subsequent tool or processing station. Various other mechanisms for sealing the outlets 100 and inlets 70 and 85 may also be employed.

Figure 2:
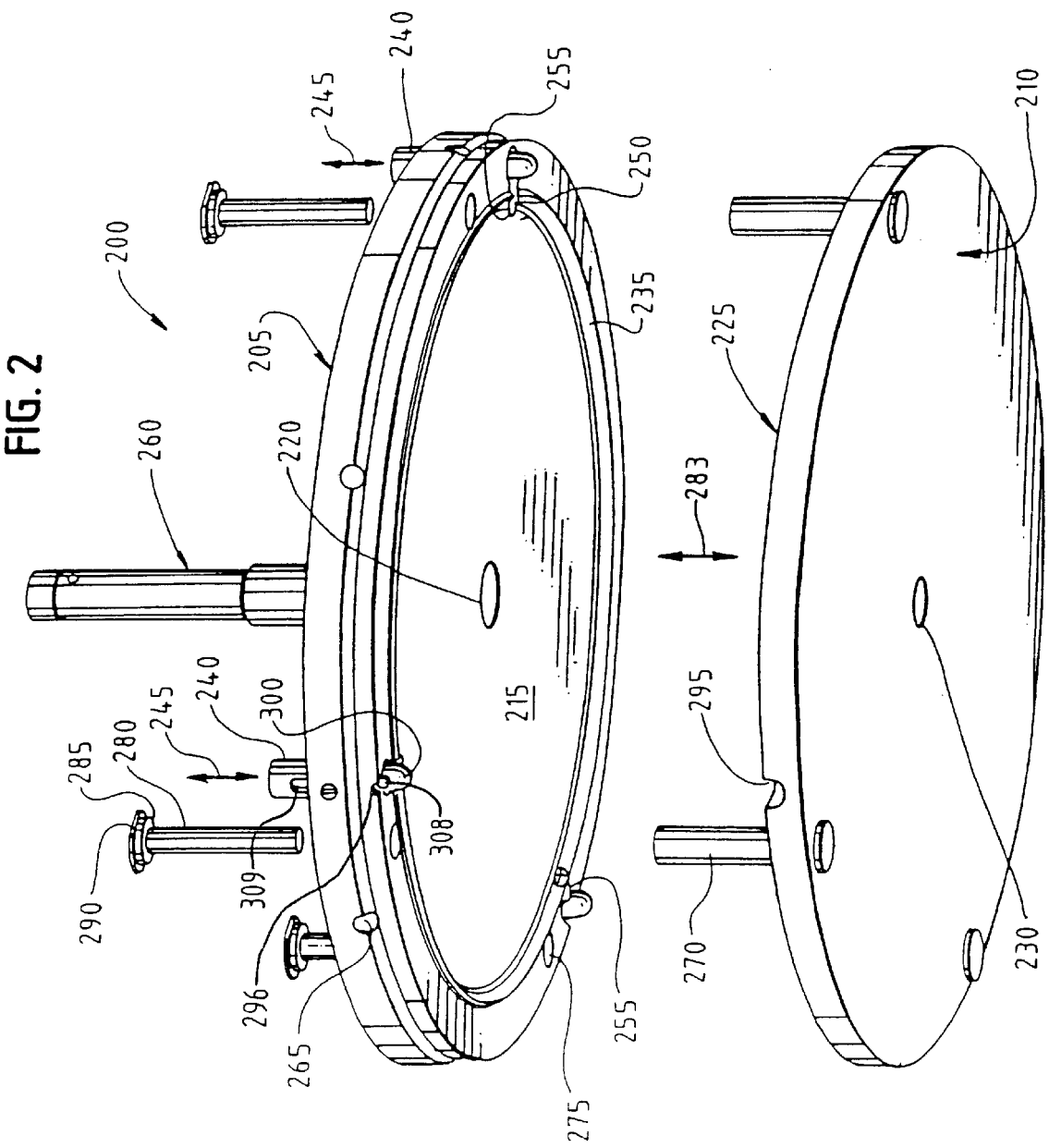
FIG. 2 is an exploded view of a further embodiment of a rinser/dryer housing constructed in accordance with the teachings above the present invention.

FIG. 2 is a perspective view of a further rinser/dryer construction wherein the rinser/dryer is disposed at a fixed processing station and can open and close to facilitate insertion and extraction of the workpiece. The rinser/dryer, shown generally at 200, is comprised of separable upper and lower chamber members, 205 and 210, respectively. As in the prior embodiment, the upper chamber member 205 includes a generally planar chamber face 215 having a centrally disposed inlet 220. Although not shown in the view of FIG. 2, the lower chamber member 210 likewise has a generally planar interior chamber face 225 having a central inlet 230 disposed therethrough. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece of therebetween. With a workpiece disposed between them, the upper and lower chamber members, 205 and 210, move toward one another to form a chamber in which the workpiece is supported in a position in which it is spaced from the planar interior chamber faces 215 and 225. In the embodiment of the rinser/dryer disclosed in FIGS. 2–8B, the workpiece, such as a semiconductor wafer, is clamped in place in the chamber formed by the upper and lower chamber members, 205 and 210, between a plurality of support members 240 and corresponding spacing members 255 when the upper and lower chamber members are joined to form the chamber (see FIG. 7B). Axial movement of the upper and lower chamber members toward and away from each other is facilitated by a plurality of fasteners 307, the construction of which will be described in further detail below. Preferably, the plurality of fasteners 307 bias the upper and lower chambers to a closed position such as illustrated at FIG. 7A.

In the disclosed embodiment, the plurality of wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are disposed in a closed position (see FIG. 7A), and to allow the support members 240 to release the wafer from such clamping action when the upper and lower chamber members are separated (see FIG. 8A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 5. In the closed position, the notches 295 and corresponding notches 296 of the upper chamber member (see FIG. 2) provide a plurality of outlets at the peripheral regions of the rinser/dryer 200. Radial alignment of the arm 250 of each support member 240 is maintained by a set pin 308 that extends through lateral grooves 309 disposed through an upper portion of each support member.

Figure 6:
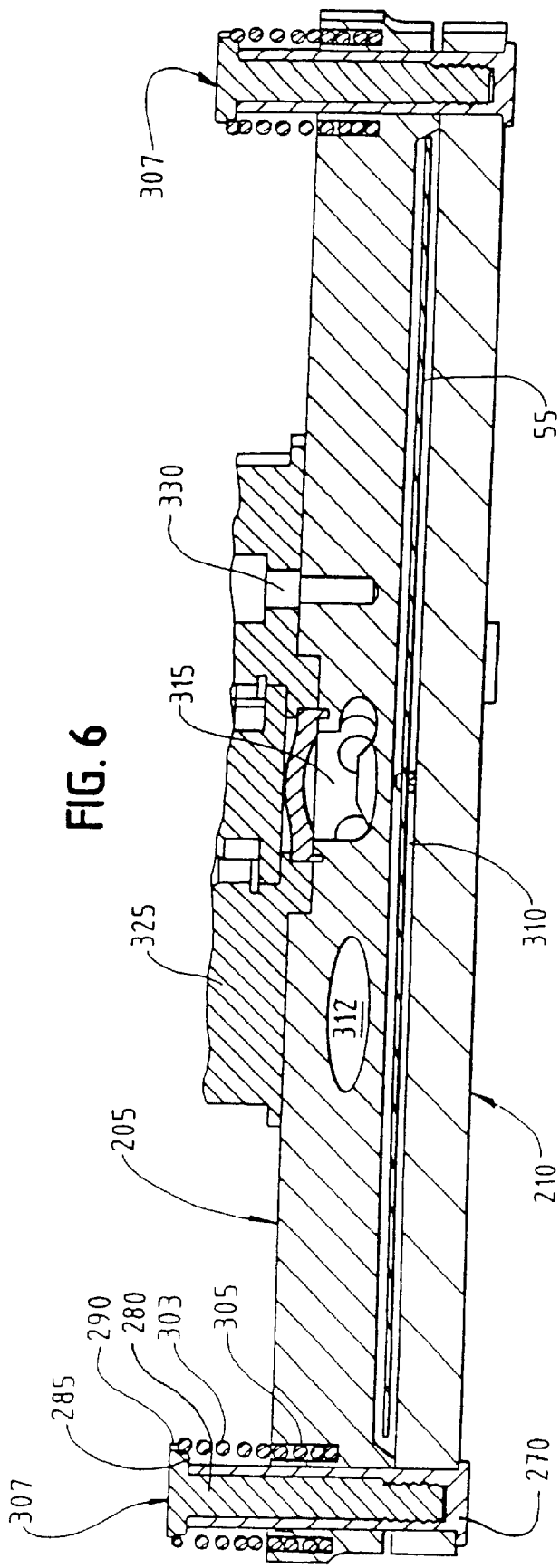
FIG. 6 is a cross-sectional view of the rinser/dryer housing taken along line VI—VI of FIG. 3.
Figure 7B:
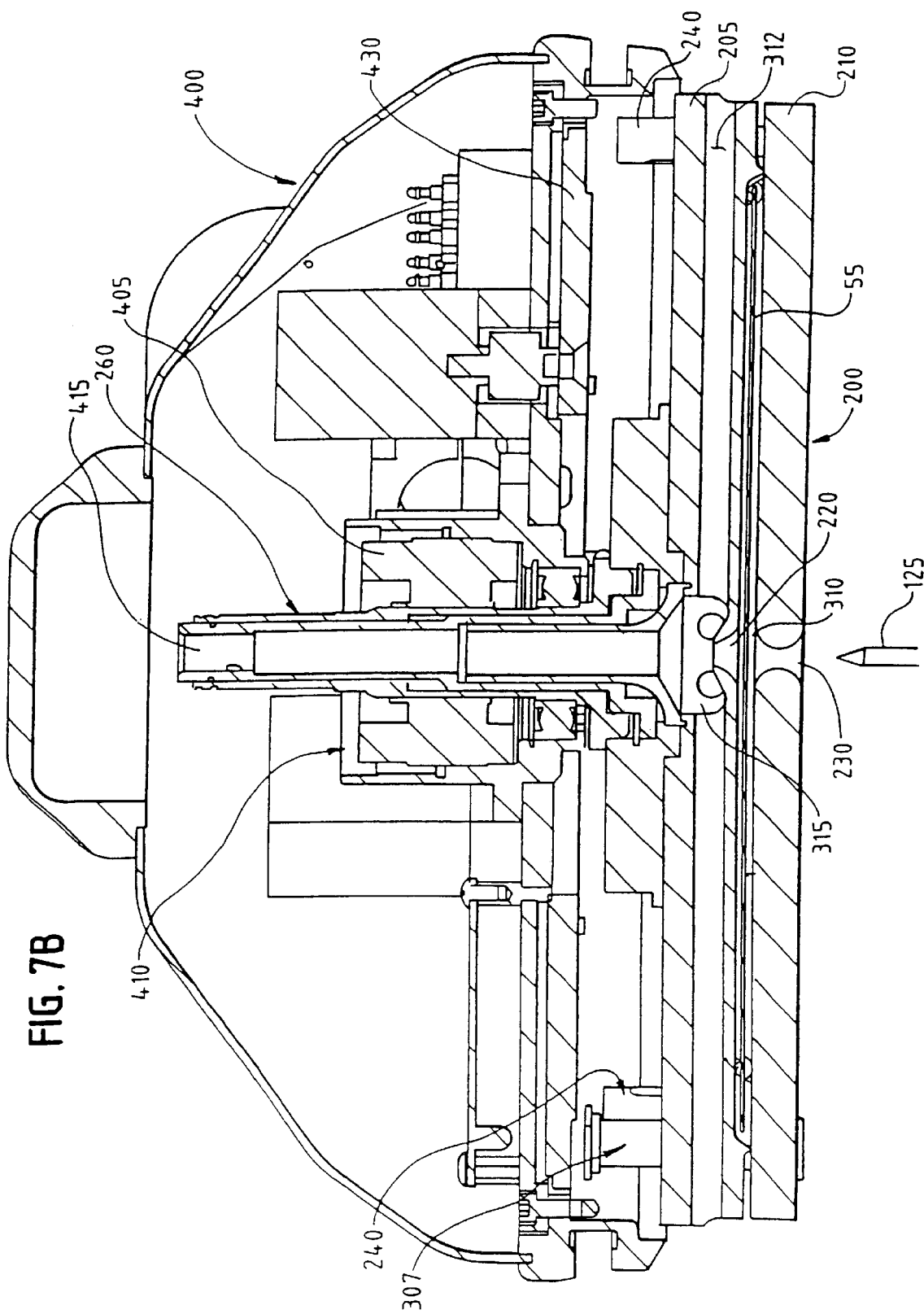

The construction of the fasteners 307 that allow the upper and lower chamber members to be moved toward and away from one another is illustrated with respect to FIGS. 2, 6 and 7B. As shown, the lower chamber member 210 includes a plurality of hollow cylinders 270 that are fixed thereto and extend upward through corresponding apertures 275 at the peripheral region of the upper chamber member 205 to form lower portions of each fastener 307. Rods 280 extend into the hollow of the cylinders 270 and are secured therein to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 6) or the like, acts to bias the upper and lower chamber members, 205 and 210, to the closed position.

With reference to FIG. 6, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The rinser/dryer 200 is designed to be rotated about a central axis during processing of the workpiece. To this end, a centrally disposed shaft 260 extends from an upper portion of the upper chamber member 205. As will be illustrated in further detail below in FIGS. 7A–8B, the shaft 260 is connected to engage a rotary drive motor for rotational drive of the rinser/dryer 200. The shaft 260 is constructed to have a centrally disposed fluid passageway (see FIG. 4) through which a processing fluid may be provided to inlet 220. Alternatively, the central passageway may function as a conduit for a separate fluid inlet tube or the like.

Figure 3:
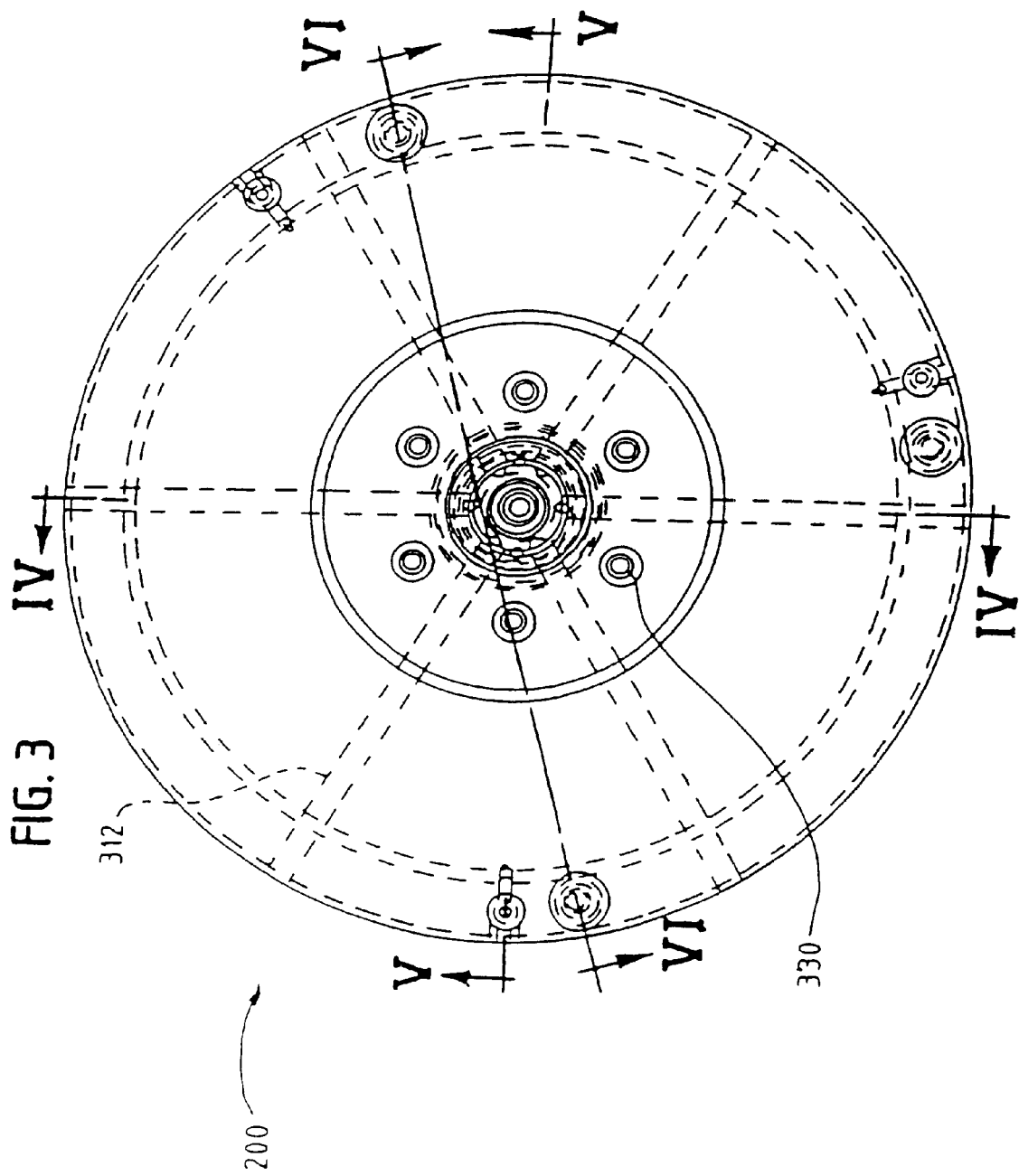
FIG. 3 is a top plan view of the rinser/dryer housing of FIG. 2 when the housing is in an assembled state.

As illustrated in FIGS. 3 and 4, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 5). Overflow passages 312 allow processing fluid to exit the chamber 310 when the flow of fluid to the chamber 310 exceeds the fluid flow from the peripheral outlets of the chamber.

Figure 8A:
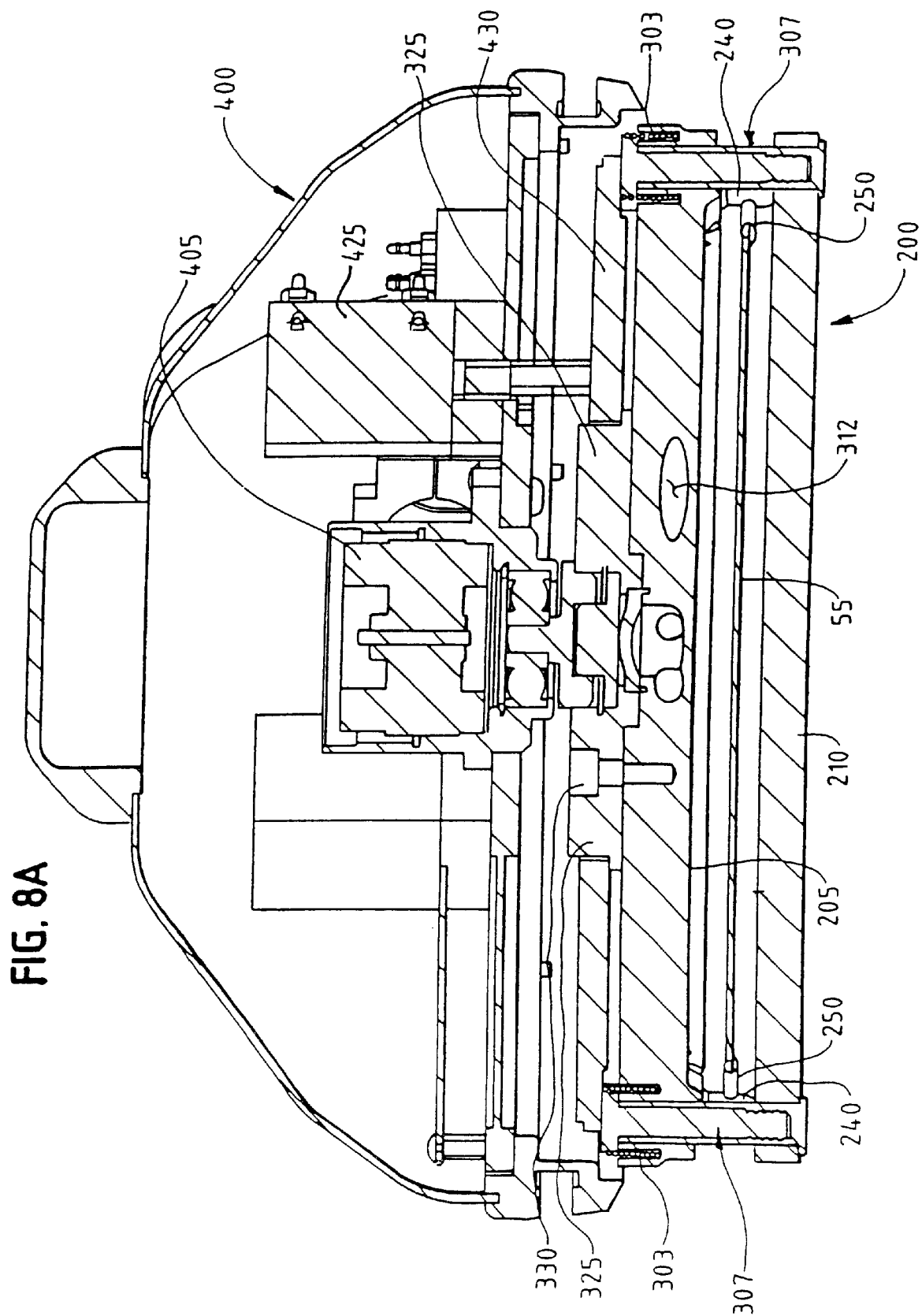
FIGS. 8A and 8B are cross-sectional views showing the rinser/dryer housing in an open state and connected to a rotary drive assembly.
Figure 8B:
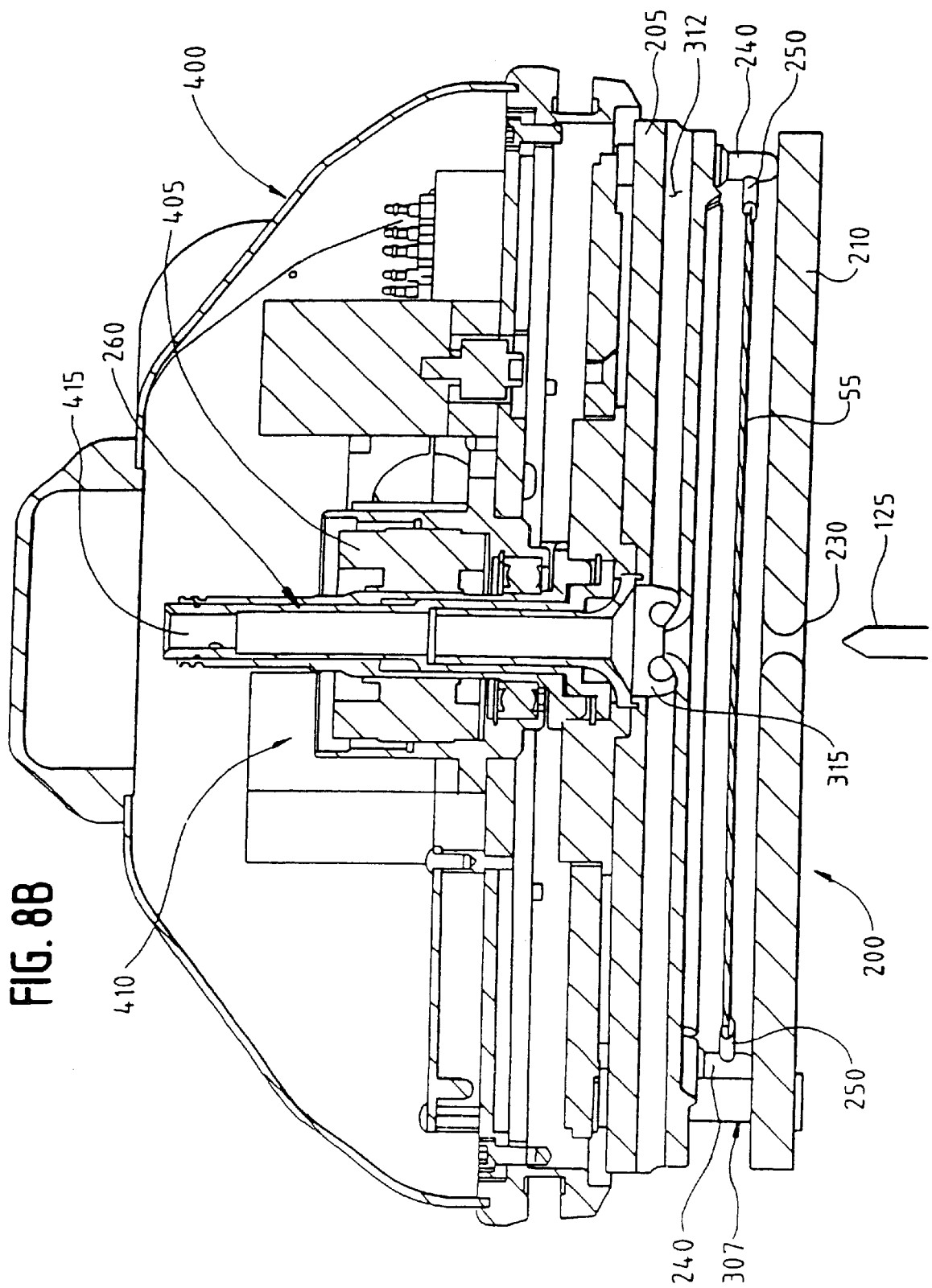

FIGS. 7A and 7B are cross-sectional views showing the rinser/dryer 200 in a closed state and connected to a rotary drive assembly, shown generally at 400, while FIGS. 8A and 8B are similar cross-sectional views showing the rinser/dryer 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 1, the upper and lower chamber members 205 and 2 10 join to define the substantially closed rinser/dryer chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 therebetween when the rinser/dryer 200 is in the closed position of FIGS. 7A and 7B.

It is in the closed state of FIGS. 7A and 7B that processing of the wafer 55 takes place. With the wafer secured within the rinser/dryer chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the rinser/dryer 200 is rotated by the rotary drive motor assembly 410, any fluid supplied through inlets 220 and 230 is driven across the surfaces of the wafer 55 by forces generated through centripetal acceleration. Spent processing fluid exits the processing chamber 310 from the outlets at the peripheral regions of the rinser/dryer 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the rinser/dryer 200 is opened to allow access to the wafer, such as shown in FIGS. 8A and 8B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205. As the lower chamber member 210 is lowered, the support members 240 follow it under the influence of gravity or a biasing member while concurrently lowering the wafer 55. In the lower position, the rinser/dryer chamber 310 is opened thereby exposing the wafer 55 for removal and/or allowing a new wafer to be inserted into the rinser/dryer 200. Such insertion and extraction can take place either manually, or by an automatic robot.

Figure 9:
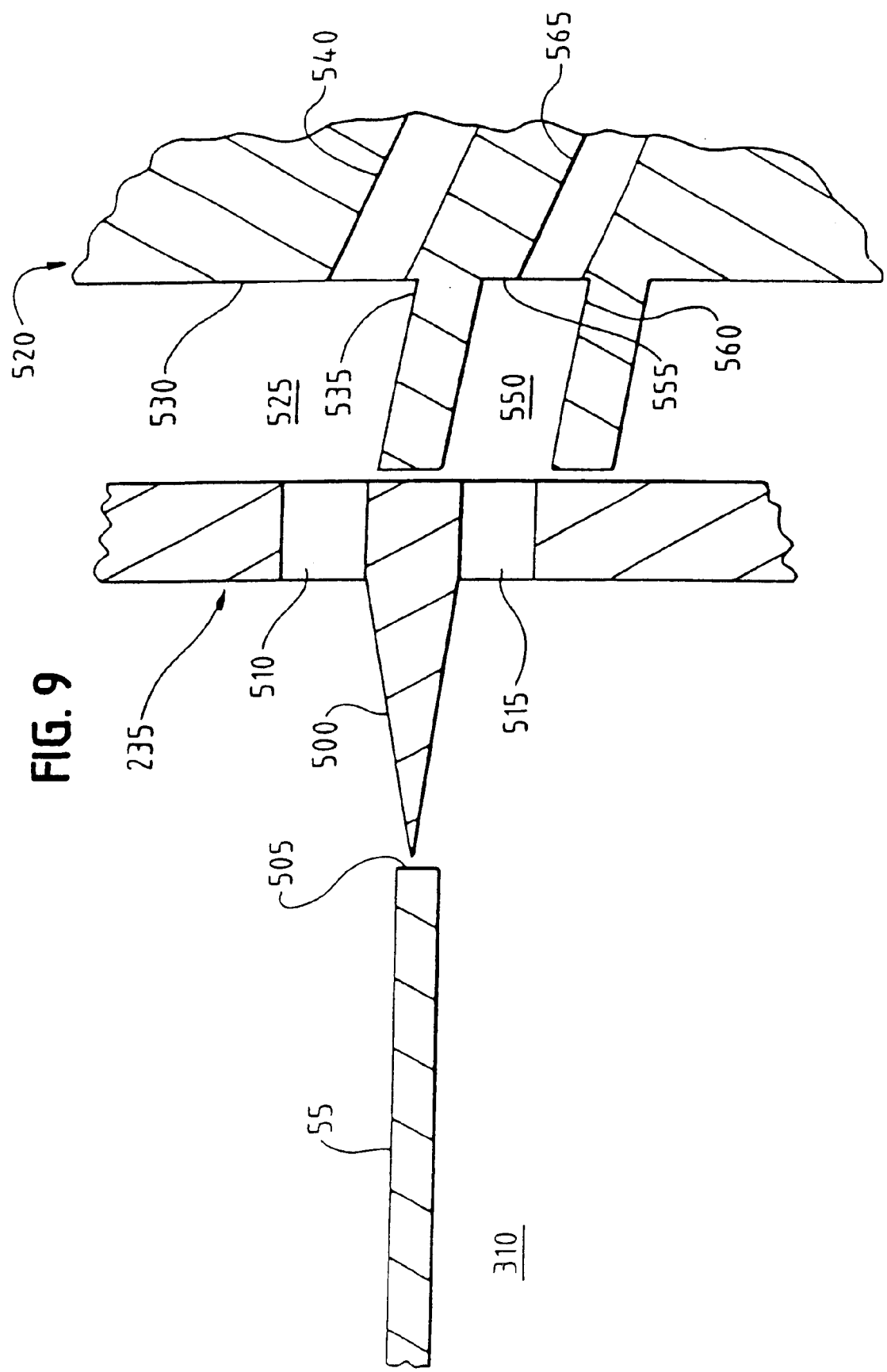
FIG. 9 illustrates one embodiment of an edge configuration that facilitates mutually exclusive processing of the upper and lower wafer surfaces in the rinser/dryer housing.

FIG. 9 illustrates an edge configuration that facilitates separate processing of each side of the wafer 55. As illustrated, a dividing member 500 extends from the sidewall 235 of the rinser/dryer chamber 310 to a position immediately proximate the peripheral edge 505 of the wafer 55. The dividing member 500 may take on a variety of shapes, the illustrated tapered shape being merely one configuration. The dividing member 500 preferably extends about the entire circumference of the chamber 310. A first set of one or more outlets 510 is disposed above the dividing member 500 to receive spent rinsing/drying fluid from the upper surface of the wafer 55. Similarly, a second set of one or more outlets 515 is disposed below the dividing member 500 to receive spent rinsing/drying fluid from the lower surface of the wafer 55. When the wafer 55 rotates during processing, the fluid through supply 415 is provided to the upper surface of the wafer 55 and spreads across the surface through the action of centripetal acceleration. Similarly, the fluid from supply tube 125 is provided to the lower surface of the wafer 55 and spreads across the surface through the action of centripetal acceleration. Because the edge of the dividing member 500 is so close to the peripheral edge of the wafer 55, rinsing/drying fluid from the upper surface of the wafer 55 does not proceed below the dividing member 500, and rinsing/drying fluid from the lower surface of the wafer 55 does not proceed above the dividing member 500. As such, this rinser/dryer construction makes it possible to concurrently process both the upper and lower surfaces of the wafer 55 in a mutually exclusive manner using different rinsing/drying fluids and steps.

FIG. 9 also illustrates one manner in which the rinsing/drying fluids supplied to the upper and lower wafer surfaces may be collected in a mutually exclusive manner. As shown, a fluid collector 520 is disposed about the exterior periphery of the rinser/dryer 200. The fluid collector 520 includes a first collection region 525 having a splatter stop 530 and a fluid trench 535 that is structured to guide fluid flung from the outlets 510 to a first drain 540 where the spent fluid from the upper wafer surface may be directed to a collection reservoir for disposal or re-circulation. The fluid collector 520 further includes a second collection region 550 having a further splatter stop 555 and a further fluid trench 560 that is structured to guide fluid flung from the outlets 515 to a second drain 565 where the spent fluid from the lower wafer surface may be directed to a collection reservoir for disposal or re-circulation.

Figure 10:
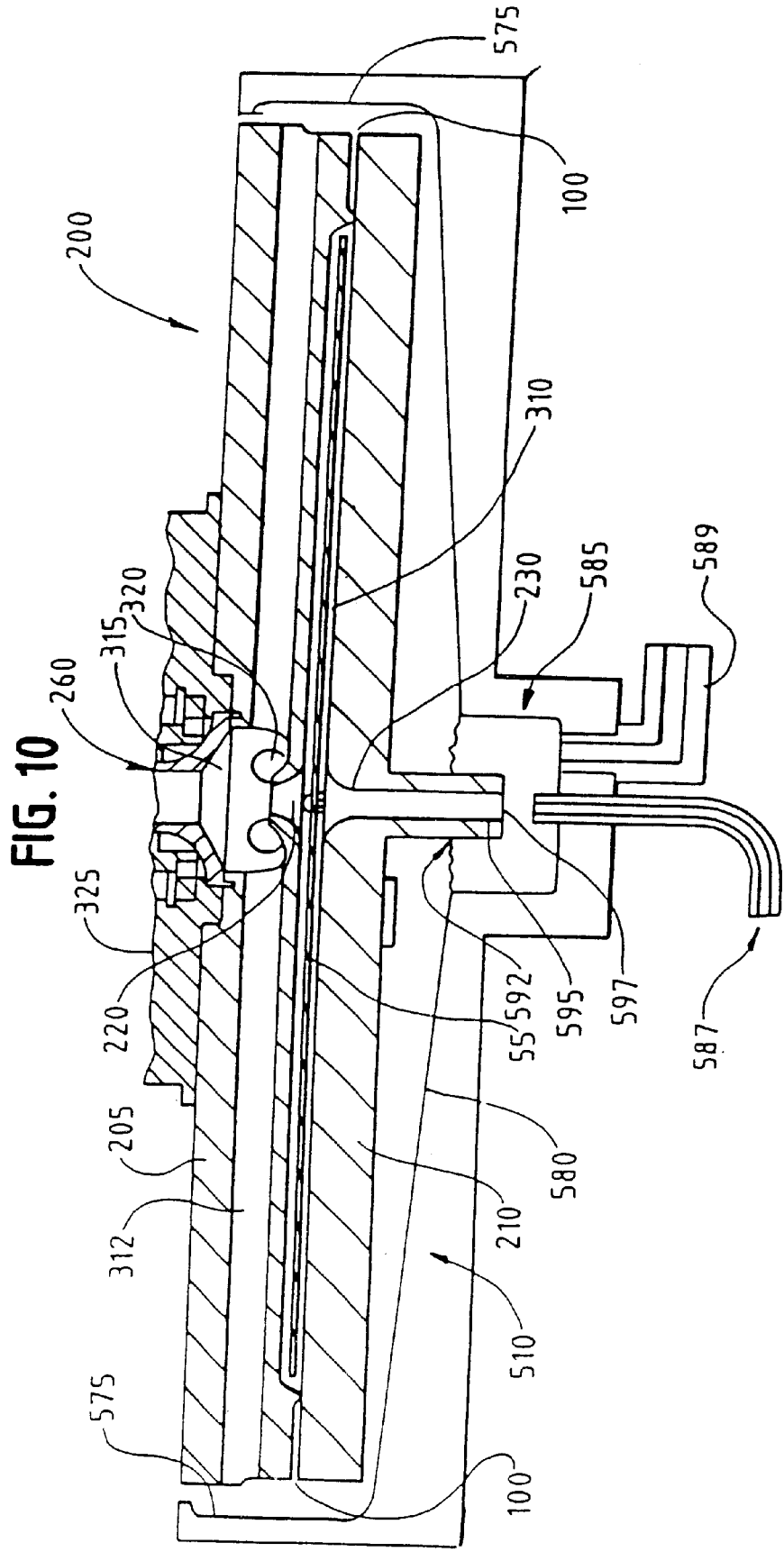
FIG. 10 illustrates an embodiment of the rinser/dryer housing employed in connection with a self-pumping recirculation system.

FIG. 10 illustrates an embodiment of the rinser/dryer 200 having an alternate configuration for supplying rinsing/ drying fluid-through the fluid inlet opening 230 in the interior chamber face 225. As shown, the rinser/dryer housing 200 is disposed in a cup 570. The cup 570 includes sidewalls 575 exterior to the outlets 100 to collect fluid as it exits the chamber 310. An angled bottom surface 580 directs the collected fluid to a sump 585. Fluid supply line 587 is connected to provide an amount of fluid to the sump 585. The sump 585 is also preferably provided with a drain valve 589. An inlet stem 592 defines a channel 595 that includes a first end having an opening 597 that opens to the sump 585 at one end thereof and a second end that opens to the inlet opening 230.

In operation of the embodiment shown in FIG. 10, rinsing fluid is provided through supply line 587 to the sump 585 while the rinser/dryer 200 is spinning. Once the sump 585 is full, the fluid flow to the sump through supply line 587 is eliminated. Centripetal acceleration resulting from the spinning of the rinser/dryer 200 provides a pressure differential that drives the fluid through openings 597 and 230, into chamber 310 to contact at least the lower surface of the wafer 55, and exit outlets 100 where the fluid is re-circulated to the sump 585 for further use. After rinsing, the rinsing fluid is drained from sump 585, and a drying fluid is supplied thereto.

There are numerous advantages to the self-pumping re-circulation system illustrated in FIG. 10. The tight fluid loop minimizes lags in process parameter control thereby making it easier to control such physical parameters as fluid temperature, fluid flow, etc. Further, there is no heat loss to plumbing, tank walls, pumps, etc. Still further, the system does not use a separate pump, thereby eliminating pump failures which are common when pumping hot, aggressive chemistries.

FIGS. 11 and 12 illustrate two different types of processing tools, each of which may employ one or more processing stations including the rinser/dryer constructions described above. FIG. 11 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etching processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual rinser/dryer housings, such as at 20 of FIG. 1.

Each of the processing stations 605 may be accessed by a robotic arm 610. The robotic arm 610 transports the rinser/dryer housings, or individual wafers, to and from the input/output station 607. The robotic arm 610 also transports the wafers or housings between the various processing stations 605.

In the embodiment of FIG. 11, the robotic arm 610 rotates about axis 615 to perform the transport operations along path 606. In contrast, the tool shown generally at 620 of the FIG. 12 utilizes one or more robotic arms 625 that travel along a linear path 630 to perform the required transport operations. As in the embodiment of FIG. 10, a plurality of individual processing stations 605 are used, but more processing stations 605 may be provided in a single processing tool in this arrangement.

Figure 13:
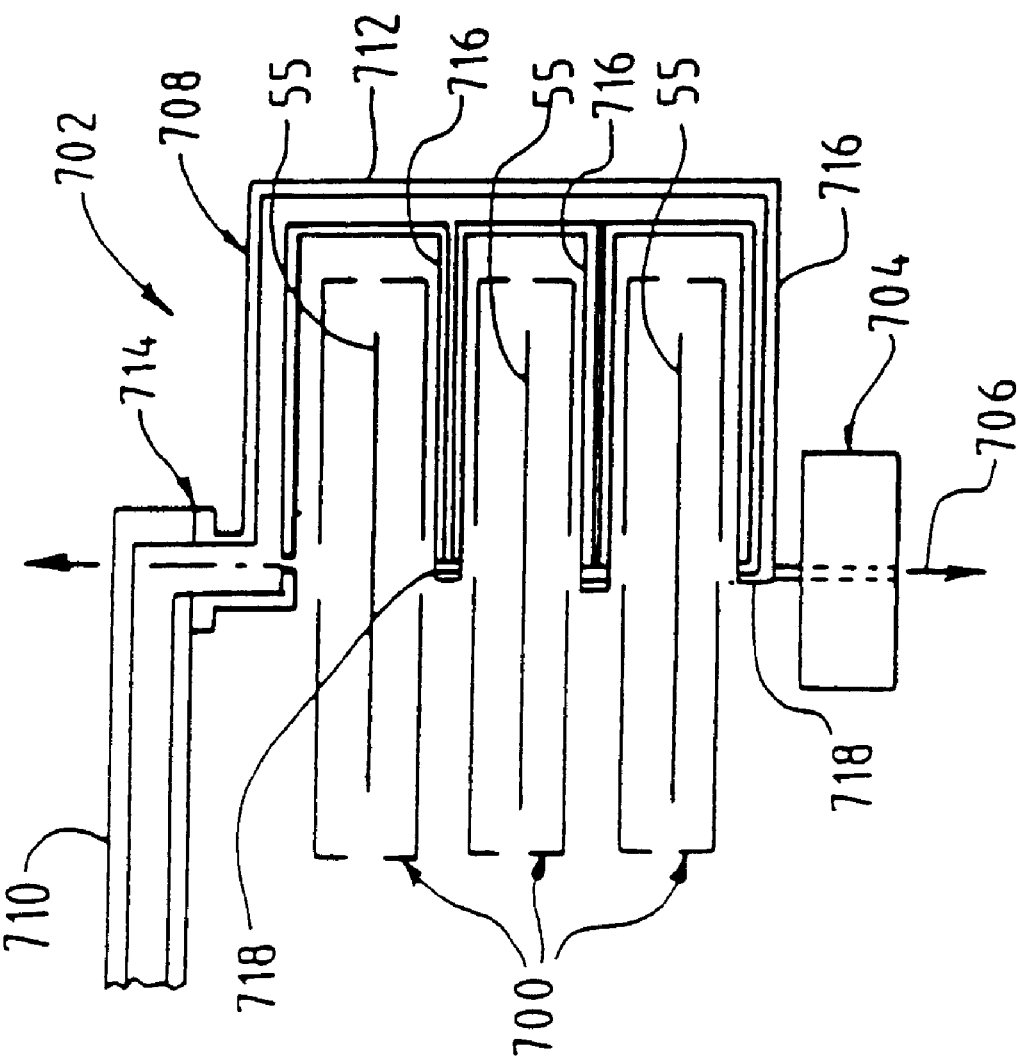
FIG. 13 illustrates a batch wafer rinser/dryer constructed in accordance with the principles of the present invention.

FIG. 13 illustrates one manner of employing a plurality of rinser/dryer housings 700, such as those described above, in a batch processing apparatus 702. As shown, the rinser/dryer housings 700 are stacked vertically with respect to one another and are attached for rotation by a common rotor motor 704 about a common rotation axis 706. The apparatus 702 further includes a process fluid delivery system 708. The delivery system 708 includes a stationary manifold 710 that accepts rinsing/drying fluid from a fluid supply (not shown). The stationary manifold 710 has an outlet end connected to the input of a rotating manifold 712. The rotating manifold 712 is secured for co-rotation with the housings 700 and, therefore, is connected to the stationary manifold 710 at a rotating joint 714. A plurality of fluid supply lines 716 extend from the rotating manifold 712 and terminate at respective nozzle portions 718 proximate inlets of the housings 700. Nozzle portions 718 that are disposed between two housings 700 are constructed to provide fluid streams that are directed in both the upward and downward directions. In contrast, the lowermost supply line 716 includes a nozzle portion 718 that directs a fluid stream, only in the upward direction. The uppermost portion of the rotating manifold 712 includes an outlet 720 that provides rinsing/drying fluid to the fluid inlet of the uppermost housing 700.

The batch processing apparatus 702 of FIG. 13 is constructed to concurrently supply the same fluid to both the upper and lower inlets of each housing 700. However, other configurations may also be employed. For example, nozzle portions 718 may include valve members that selectively opening in close depending on whether the fluid is to be supplied through the upper and/or lower inlets of each housing 700. In such instances, it may be desirable to employ an edge configuration, such as the one shown in FIG. 9, in each of the housings 700 to provide isolation of the fluids supplied to the upper and lower surfaces of the wafers 55. Still further, the apparatus 702 may include concentric manifolds for supplying two different fluids concurrently to individual supply lines respectively associated with the upper and lower inlets of the housings 700.

FIG. 14 illustrates one manner of controlling the provision of rinsing/drying fluids that are supplied to the rinser/dryer of any of the foregoing embodiments. As illustrated, the fluid supply system, shown generally at 800, includes a nitrogen gas supply 805, an IPA supply 810, an IPA vaporizer 815, a DI water supply 820, optional heating elements 825, optional flowmeters 830, optional flow regulators/temperature sensors 835, and valve mechanism 840. All of the various components of the system 800 may be under the control of a controller unit 845 having the appropriate software programming.

In operation of the rinser/dryer, the valve mechanism 840 is connected to supply DI water from supply 820 to both the upper and lower inlets of the rinser/dryer chamber. As the water is supplied to the chamber, the wafer is spun at, for example, a rate of 200 RPM. This causes the water to flow across each surface of the wafer under the action of centripetal acceleration. Once a sufficient amount of water has been supplied to the chamber to rinse the wafer surfaces, valve mechanism 840 is operated to provide a drying fluid, preferably comprised of nitrogen and IPA vapor, to both the upper and lower inlets of the rinser/dryer chamber. Valve mechanism 840 is preferably operated so that the front of the drying fluid immediately follows the trailing end of the DI water. As the drying fluid enters the chamber, centripetal acceleration resulting from the spinning of the wafer drives the drying fluid across the wafer surface and follows a meniscus across the wafer surface formed by the DI water. The IPA vapor assists in providing a drying of the surface of the wafer at the edge of the meniscus. Drying of the wafer may be further enhanced by heating the DI water and/or the nitrogen/IPA vapor using heating elements 825. The particular temperature at which these fluids are supplied may be controlled by the controller 845. Similarly, flow regulators 835 and flowmeters 830 may be used by controller 845 to regulate the flow of the DI water and/or the nitrogen/IPA vapor to the rinser/dryer chamber.

Numerous substantial benefits flow from the use of the disclosed rinser/dryer configurations. Many of these benefits arise directly from the reduced fluid flow areas in the rinser/dryer chambers. Generally, there is a more efficient use of the rinsing/drying fluids since very little of the fluids are wasted. Further, it is often easier to control the physical parameters of the fluid flow, such as temperature, mass flow, etc., using the reduced fluid flow areas of the rinser/dryer chambers. This gives rise to more consistent results and makes those results repeatable.

On an individual wafer basis, the drying time for the ;individual wafer in the disclosed systems is substantially reduced when compared to the more traditional Marangoni process implementations. The drying time in such processes is governed by the following equation:

$$t = \frac{d}{v}$$

where:
=drying time;
d=wafer diameter; and
v=meniscus velocity.

As such, the drying time is directly proportional to the diameter of the wafer, which is the distance that the meniscus travels over the wafer surface. In the rinser/dryer of the present invention, the meniscus originates at the center of the wafer and, as such, experiences a travel distance that is effectively ½ of the total diameter of the wafer. This results in a drying time that is approximately ½ of the drying time experienced in a typical Marangoni processor in which the entire wafer is submersed in the rinsing fluid and gradually extracted therefrom.

The foregoing constructions also give rise to the ability to perform sequential processing of a single wafer using two or more rinsing/drying fluids sequentially provided through a single inlet of the reaction chamber. Still further, the ability to concurrently provide different fluids to the upper and lower surfaces of the wafer opens the opportunity to implement novel rinsing/drying processing operations.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A method for rinsing and drying a workpiece comprising:
   inserting the workpiece between an upper chamber member and a lower chamber member used to provide a rinser/dryer chamber around the workpiece;
   introducing a flow of rinsing fluid onto the workpiece;
   rotating the workpiece to generate centrifugal force to distribute the flow of rinsing fluid across at least one surface of the workpiece;
   providing a flow of drying fluid onto the workpiece after the rinsing fluid;
   rotating the workpiece to generate centrifugal force to distribute the flow of drying fluid across the at least one surface of the workpiece; and wherein at least one of the rinsing and drying fluids is provided into the rinser/dryer chamber via an inlet generally aligned with an axis of rotation of the workpiece.

2. The method of claim 1 wherein the rinsing fluid comprises DI water.

3. The method of claim 1 wherein the rinsing fluid comprises IPA vapor and nitrogen.

4. The method of claim 1 wherein at least one of the rinsing and drying fluids is provided at a generally central portion of the rinser/dryer chamber.

5. The method of claim 1 wherein the rinser/dryer chamber is substantially closed.

6. The method of claim 1 further comprising the step of removing at least one of the rinsing and drying fluids from the chamber via an outlet passing through a sidewall of the chamber.

7. The method of claim 1 wherein at least one of the rinsing and drying fluids is provided onto the workpiece through an inlet opening in an upper portion of the rinser/dryer chamber.

8. The method of claim 1 wherein at least one of the rinsing and drying fluids is provided onto the workpiece through an inlet opening in a lower portion of the rinser/dryer chamber.

9. The method of claim 1 further comprising the step of providing the rinser/dryer chamber by moving upper and lower chamber members towards each other to form the rinser/dryer chamber.

10. The method of claim 9 wherein the upper and lower chamber members are moved together to substantially enclose the workpiece.

11. The method of claim 9 wherein the upper and lower chamber members are moved together to substantially enclose the workpiece.

12. The method of claim 9 further comprising the step of connecting the upper chamber member to the lower chamber member, so that rotation of the upper chamber member also causes the lower chamber member to rotate with the upper chamber member.

13. The method of claim 1 wherein the rinsing and drying fluids are introduced onto both an upper surface and a lower surface of the workpiece.

14. The method of claim 13 further comprising the step of collecting a rinsing or drying fluid from the upper surface of the workpiece and separately collecting a rinsing or drying fluid from the lower surface of the workpiece.

15. The method of claim 1 wherein the workpiece is a generally circular semiconductor wafer.

16. A method for rinsing and drying a workpiece comprising:
   inserting a workpiece between an upper chamber member and a lower chamber member;

moving upper and lower chamber members relatively towards each other to form a rinser/dryer chamber;

supporting the workpiece within the rinser/dryer chamber between upper supports attached to an upper interior chamber face of the upper chamber member and lower supports on the lower chamber member;

introducing a flow of rinsing fluid onto the workpiece;

rotating the workpiece to generate centrifugal force to distribute the flow of rinsing fluid across at least one surface of the workpiece;

providing a flow of drying fluid onto the workpiece after the rinsing fluid; and rotating the workpiece to generate centrifugal force to distribute the flow of drying fluid across the at least one surface of the workpiece.

17. The method of claim 16 wherein the upper supports maintain the workpiece spaced apart from the upper interior chamber face and wherein the lower chamber member includes a lower interior chamber face and the lower supports maintain the workpiece spaced apart from the lower interior chamber face.

18. A method for rinsing and drying a workpiece comprising:

inserting the workpiece between an upper chamber member and a lower chamber member;

moving at least one of the upper and lower chamber member towards the other to form a rinser/dryer chamber with the upper and lower chamber members having flat upper and lower interior chamber faces, respectively, and with the upper and lower surfaces of the workpiece positioned parallel to the upper and lower interior chamber faces;

introducing a flow of rinsing fluid onto the workpiece;

rotating the workpiece to generate centrifugal force to distribute the flow of rinsing fluid across at least one surface of the workpiece;

providing a flow of drying fluid onto the workpiece after the rinsing fluid; and rotating the workpiece to generate centrifugal force to distribute the flow of drying fluid across the at least on surface of the workpiece.

19. A method for rinsing and drying a workpiece comprising:

inserting a workpiece between an upper chamber member and a lower chamber member;

bringing the upper and lower chamber members together to form a rinser/dryer chamber;

introducing a flow of rinsing fluid onto the workpiece;

rotating the workpiece to generate centrifugal force to distribute the flow of rinsing fluid across at least one surface of the workpiece;

providing a flow of drying fluid onto the workpiece after the rinsing fluid;

rotating the workpiece to generate centrifugal force to distribute the flow of drying fluid across the at least one surface of the workpiece; and moving the upper and lower chamber members vertically away from each other, and then unloading the workpiece.

20. A method for rinsing and drying a workpiece comprising the steps of:

moving at least one of an upper chamber member and a lower chamber member toward the other to form a rinser/dryer chamber around the workpiece;

supporting the workpiece within the rinser/dryer chamber between upper supports on the upper chamber member and lower supports on the lower chamber member;

introducing a flow of rinsing fluid onto the workpiece;

rotating the workpiece to generate centrifugal force to distribute the flow of rinsing fluid across at least one surface of the workpiece;

providing a flow of drying fluid onto the workpiece after the rinsing fluid; and rotating the workpiece to generate centrifugal force to distribute the flow of drying fluid across the at least one surface of the workpiece.

21. The method of claim 20 wherein the upper supports maintain the workpiece spaced apart from the upper interior chamber face and wherein the lower chamber member includes a lower interior chamber face and the lower supports maintain the workpiece spaced apart from the lower interior chamber face.

22. The method of claim 20 wherein the rinser/dryer chamber generally conforms to the shape of the workpiece.

23. The method of claim 20 wherein the rinsing fluid comprises IPA vapor.

24. The method of claim 20 further comprising the step of clamping the workpiece between the upper and lower supports.

25. The method of claim 20 further including the step of removing rinsing or drying fluid from the rinser/dryer chamber through an overflow passageway.

26. The method of claim 20 further including the step of removing rinsing or drying fluid from the chamber through an outlet adjacent to an edge of the workpiece.

27. The method of claim 20 further comprising the step of inserting the workpiece between the upper and chamber members, before moving the upper and lower chamber members towards each other to form the rinser/dryer chamber.

28. The method of claim 20 wherein the rinsing and drying fluids are introduced onto both an upper surface and a lower surface of the workpiece.

29. The method of claim 20 further comprising the step of collecting a rinsing or drying fluid from the upper surface of the workpiece and separately collecting a rinsing or drying fluid from the lower surface of the workpiece.

30. The method of claim 20 wherein the workpiece is a generally circular semiconductor wafer.

31. The method of claim 20 where the upper and lower chamber members have flat upper and lower interior chamber faces, respectively, with the upper and lower surfaces of the workpiece positioned parallel to the upper and lower interior chamber faces.

32. The method of claim 20 further comprising the step connecting the upper chamber member to the lower chamber member, so that rotation of the upper chamber member also cause the lower chamber member to rotate with the upper chamber member.

33. The method of claim 20 wherein the rinsing and drying fluids are introduced to an upper surface and to a lower surface of the workpiece.

34. A method for rinsing and drying a workpiece comprising:

providing a rinser/dryer chamber around the workpiece;

introducing a flow of rinsing fluid onto both an upper surface and a lower surface of the workpiece.

rotating the workpiece to generate centrifugal force to distribute the flow of rinsing fluid across at least one surface of the workpiece;
providing a flow of drying fluid onto the workpiece after the rinsing fluid;
rotating the workpiece to generate centrifugal force to distribute the flow of drying fluid across the at least one surface of the workpiece; and
collecting a rinsing or drying fluid from the upper surface of the workpiece and
separately collecting a rinsing or drying fluid from the lower surface of the workpiece.

35. A method for rinsing and drying a workpiece comprising:
moving first and second chamber members relatively towards each other to form a rinser/dryer chamber around the workpiece;
connecting the first chamber member to the second chamber member, so that rotation of the first chamber member also causes the second chamber member to rotate with the first chamber member;
introducing a flow of rinsing fluid onto the workpiece;
rotating the workpiece to generate centrifugal force to distribute the flow of rinsing fluid across at least one surface of the workpiece;
providing a flow of drying fluid onto the workpiece after the rinsing fluid; and
rotating the workpiece to generate centrifugal force to distribute the flow of drying fluid across the at least one surface of the workpiece.

36. A method for rinsing and drying a workpiece comprising;
providing a rinser/dryer chamber around the workpiece;
supporting an upper surface of the workpiece with upper supports;
supporting a lower surface of the workpiece with lower supports;
inserting the workpiece between an upper chamber member and a lower chamber member used to provide a rinser/dryer chamber around the workpiece;
introducing a flow of rinsing fluid onto the workpiece;
rotating the workpiece to generate centrifugal force to distribute the flow of rinsing fluid across at least one surface of the workpiece;
providing a flow of drying fluid onto the workpiece after the rinsing fluid; and
rotating the workpiece to generate centrifugal force to distribute the flow of drying fluid across the at least one surface of the workpiece.

* * * * *